United States Patent [19]
Ryu

[11] Patent Number: 6,074,728
[45] Date of Patent: Jun. 13, 2000

[54] MULTI-LAYERED CIRCUIT SUBSTRATE

[75] Inventor: Jae-chul Ryu, Kyungki-do, Rep. of Korea

[73] Assignee: Samsung Aerospace Industries, Ltd., Kyongsangnam-do, Rep. of Korea

[21] Appl. No.: 08/991,778

[22] Filed: Dec. 16, 1997

Related U.S. Application Data

[62] Division of application No. 08/712,117, Sep. 11, 1996, Pat. No. 5,747,222.

[51] Int. Cl.⁷ .................................. B32B 3/00; H05K 1/03
[52] U.S. Cl. ........................ 428/209; 428/210; 428/901; 174/255; 174/257; 174/258; 174/261; 174/262; 174/263; 174/264; 174/265; 430/14
[58] Field of Search ..................... 428/209, 210, 428/137, 901; 174/255, 257, 258, 261, 262, 263, 264, 265

[56] References Cited

U.S. PATENT DOCUMENTS

| | | | |
|---|---|---|---|
| 4,221,925 | 9/1980 | Finley et al. ............................. | 174/68.5 |
| 5,079,065 | 1/1992 | Masakazu et al. ...................... | 428/209 |
| 5,354,593 | 10/1994 | Grandmont et al. .................... | 428/209 |
| 5,376,403 | 12/1994 | Capote et al. ........................... | 252/514 |
| 5,450,290 | 9/1995 | Boyko et al. ............................ | 174/262 |
| 5,451,721 | 9/1995 | Tsukada et al. ......................... | 174/262 |
| 5,534,666 | 7/1996 | Ishida ..................................... | 174/260 |
| 5,599,595 | 2/1997 | McGinley et al. ....................... | 428/33 |
| 5,798,563 | 8/1998 | Feilchenfeld et al. .................. | 174/255 |
| 5,822,856 | 10/1998 | Bhatt et al. ............................. | 174/263 |

FOREIGN PATENT DOCUMENTS 8-204333  8/1996  Japan .

Primary Examiner—Deborah Jones
Assistant Examiner—Cathy F. Lam
Attorney, Agent, or Firm—Finnegan, Henderson, Farabow, Garrett & Dunner, L.L.P.

[57] ABSTRACT

A multi-layered circuit substrate and a manufacturing method thereof comprising the steps of coating the upper surface of a substrate with a photosensitive insulating layer; exposing and developing the photosensitive insulating layer to form a photosensitive insulating layer of predetermined pattern and pattern spaces; forming a conductive layer by printing a conductive ink in the pattern spaces; and forming a plurality of layers by performing the previous steps, each layer comprising a photosensitive insulating layer of predetermined pattern and pattern spaces and a conductive layer formed in the pattern spaces. The method further comprises the steps of coating an uppermost layer of the plurality of layers with an adhesive insulating layer, forming a metallic thin-film on the adhesive insulating layer by thermal pressing; etching the metallic thin-film to form a predetermined pattern of a metallic thin film; and forming a through hole into which a conductive material is implanted, the through hole penetrating the substrate, conductive layer, photosensitive insulating layer and metallic thin-film so to electrically connect the conductive layer to the patterned metallic thin-film.

11 Claims, 4 Drawing Sheets

FIG. 1(a)
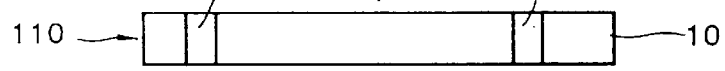
FIG. 1(b)
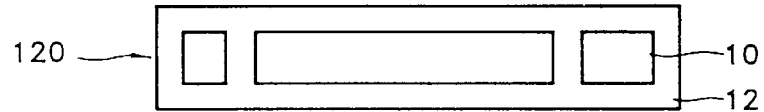
FIG. 1(c)
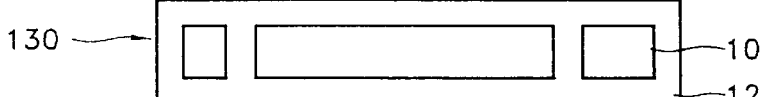
FIG. 1(d)
FIG. 1(e)
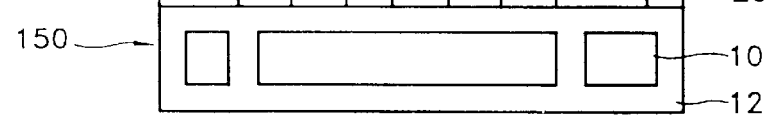
FIG. 1(f)
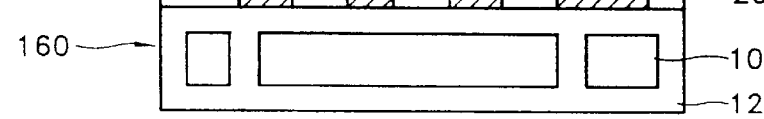
FIG. 1(g)

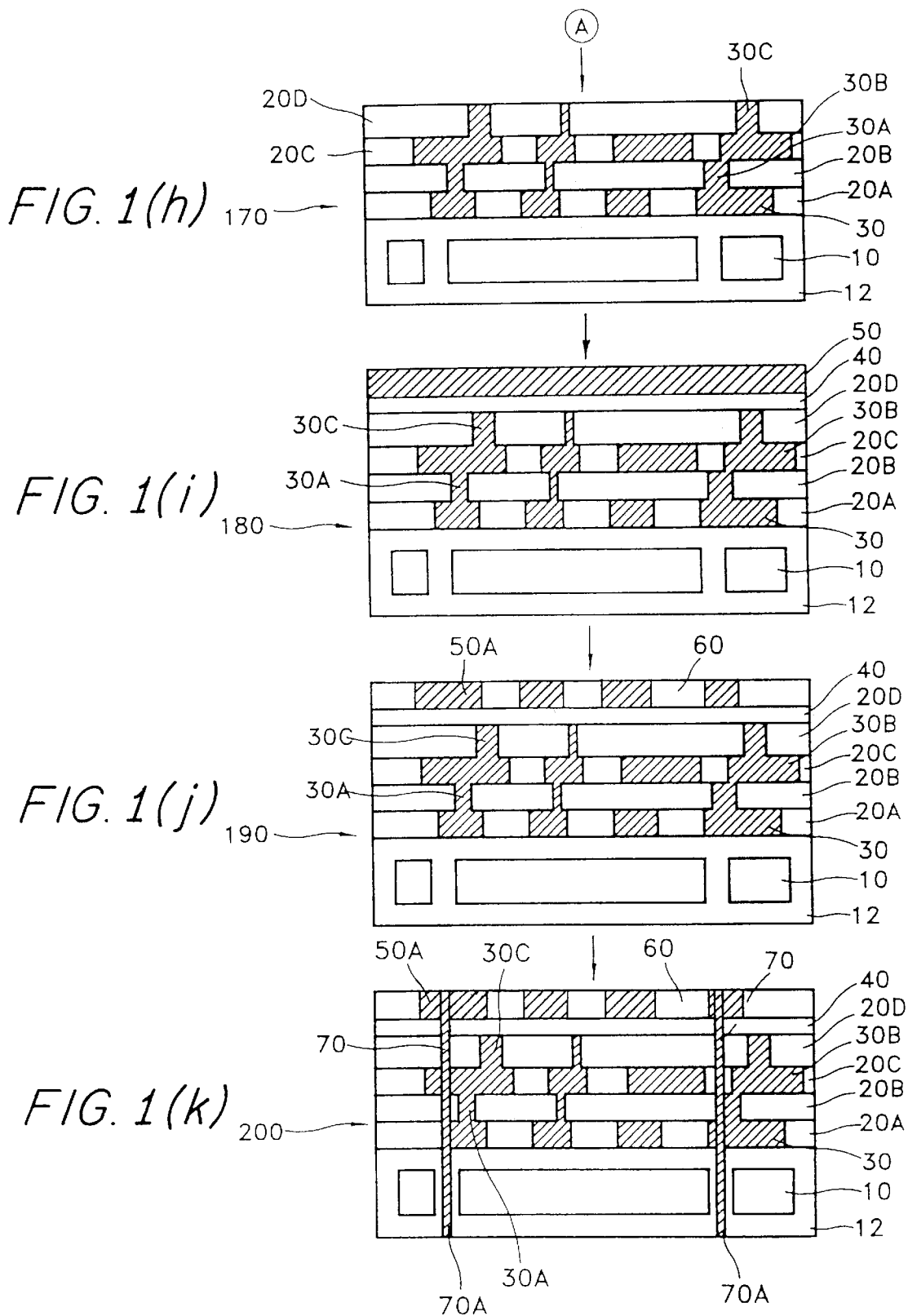

ing a method of manufacturing a multi-layered circuit sub-
MULTI-LAYERED CIRCUIT SUBSTRATE This is a division of application Ser. No. 08/712,117, filed Sep. 11, 1996, now U.S. Pat. No. 5,747,222 which is incorporated herein by reference.

BACKGROUND OF THE INVENTION

The present invention relates to a multi-layered circuit substrate and a manufacturing method thereof, and more particularly, to a multi-layered circuit substrate and a method of preparing a multi-layered circuit substrate using a conductive ink and a metallic thin-film.

Mono-layered and multi-layered circuit substrates have been used widely for semiconductor packages. In response to the need for higher integration in semiconductor packages, the multi-layered circuit substrate is used since it can integrate many devices despite its small size. A conventional multi-layered circuit substrate is manufactured by depositing and etching each layer, resulting in a complicated manufacturing process. Furthermore, the material selected for the substrate is limited to a material capable of being etched.

To solve such problems, a method has been proposed by the present applicant whereby a circuit substrate is manufactured by printing a conductive ink on the substrate, instead of using an etching process. However, in the method of manufacturing the multi-layered circuit substrate, the conductive ink layer is prone to forming a round shape due to its viscosity. In addition, the conductive ink layer cannot ensure flatness due to the different sizes of ink particles, so that wire bonding on the conductive ink layer is difficult.

SUMMARY OF THE INVENTION

Accordingly, to solve the above-mentioned problems, it is an object of the present invention to provide a multi-layered circuit substrate and a method of manufacturing thereof using a conductive ink and a metallic thin-film to facilitate wire bonding. Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

To achieve this object and in accordance with the purpose of the invention, as embodied and broadly described herein, the invention includes a method of manufacturing a multi-layered circuit substrate, comprising the steps of coating the upper surface of a substrate with a photosensitive insulating layer; exposing and developing the photosensitive insulating layer to form a photosensitive insulating layer of a predetermined pattern and pattern spaces; forming a conductive layer by printing a conductive ink in the pattern spaces; forming a plurality of layers, each layer comprising a photosensitive insulating layer of a predetermined pattern and pattern spaces and a conductive layer formed in the pattern spaces, by repeating the previous two steps; coating an uppermost layer of the plurality of layers with an adhesive insulating layer; forming a metallic thin-film on the adhesive insulating layer by thermal pressing; etching the metallic thin-film to form a predetermined pattern of a metallic thin-film; and forming a through hole into which a conductive material is implanted, the through hole being formed in the substrate, conductive layers, photosensitive insulating layers and metallic thin-film to electrically connect the conductive layers to the metallic thin-film.

Further in accordance with the purpose of the invention, as embodied and broadly described herein, the invention includes a multi-layered circuit substrate, comprising a substrate; a plurality of layers formed on the substrate, each layer comprising a photosensitive insulating layer having predetermined pattern and pattern spaces and a conductive layer formed of a conductive ink in the pattern spaces; a metallic thin-film of a predetermined pattern adhered on an uppermost layer of the plurality of layers by an adhesive insulating material; and a conductive material injected into a hole formed through the substrate, the plurality of layers, and the metallic thin-film for electrically connecting the conductive layer and metallic thin-film.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate several embodiments of the invention and together with the description, serve to explain the principles of the invention. In the drawings:

FIGS. 1(a) through 1(k) are cross-sectional views showstrate according to an embodiment of the present invention;

DETAILED DESCRIPTION OF THE INVENTION

Figure 2:
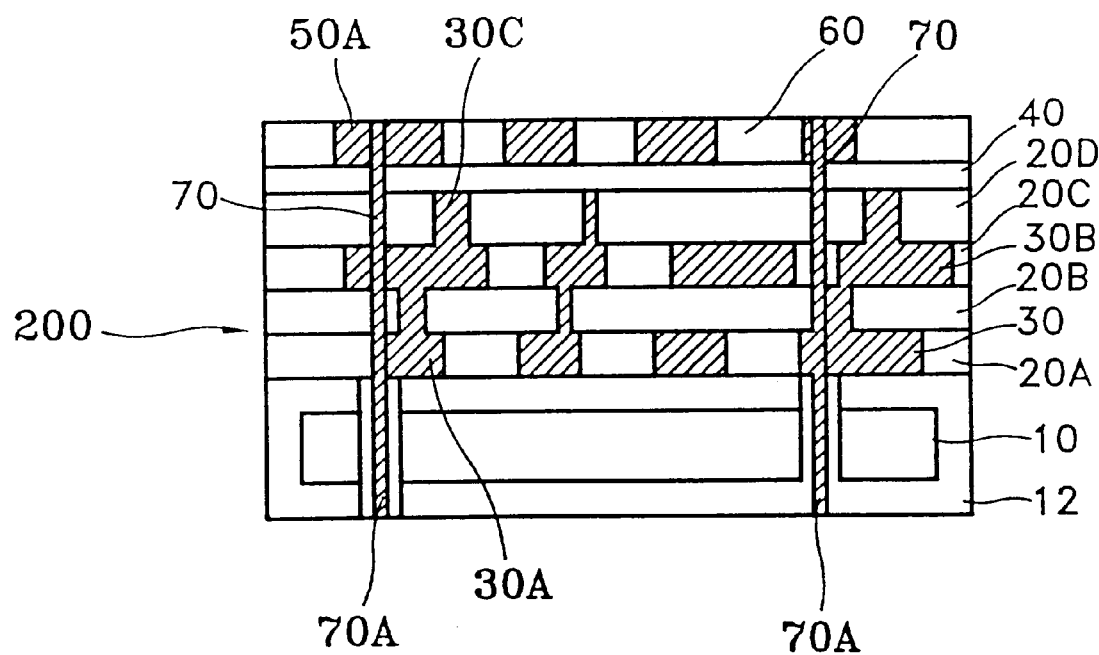
FIG. 2 is a cross-sectional view of the multi-layered circuit substrate manufactured by the manufacturing method of FIGS. 1(a)–(k)

Reference will now be made in detail to the present preferred embodiments of the invention, examples of which are illustrated in the accompanying drawings. Wherever possible, the same reference numbers will be used throughout the drawings to refer to the same or like parts.

A method of manufacturing a multi-layered circuit substrate according to one embodiment of the present invention will be described with reference to FIGS. 1(a) through 1(k).

As seen in FIG. 1(a), a substrate 10 made of metal, ceramic, or insulating material is prepared (step 100). In the preferred embodiment, substrate 10 consists of a conductive metal, e.g., alloy 42 or copper alloy, which provides excellent heat-stability and heat-emissivity. As shown in FIGS. 1(b)–(d), holes 11 are formed in the substrate 10 (step 110), the surface of the substrate 10 and the holes 11 are coated with an insulating material 12 (step 120), and a photosensitive insulating layer 20 is disposed on the surface of the insulating material 12 (step 130). On the other hand, when the substrate 10 is composed of a ceramic or an insulating material, the upper surface of the substrate 10 is coated directly with the photosensitive insulating layer 20, and step 120 is omitted.

As shown in FIG. 1(e), after a photomask 24 having a predetermined pattern is aligned on the surface of the photosensitive insulating layer 20, the substrate 10 is exposed to light 26 and developed (step 140). Then, as shown in FIG. 1(f), the exposed portion of the photosensitive insulating layer 20 is removed by a developing solution to form a photosensitive insulating layer 20A having predetermined pattern with pattern spaces 22 therebetween (step 150). As seen in FIG. 1 (g), a conductive ink is printed in pattern spaces 22 and is heated several times to be hardened, thereby forming a conductive layer 30 in the pattern spaces 22 (step 160).

As described above, a mono-layered circuit substrate is manufactured by steps 100 to 160. Thus, a multi-layered circuit substrate, as shown in FIG. 1(h), can be formed by repeating these steps (step 170). That is, a photosensitive insulating layer (not shown) is coated on the mono-layered circuit substrate to electrically insulate the mono-layered circuit substrate. After aligning a photomask having a predetermined pattern on the surface of the photosensitive insulating layer (not shown), a photosensitive insulating layer 20B of a predetermined pattern and pattern spaces (not shown) are formed through exposing and developing processes. Then, a conductive layer 30A is formed by printing a conductive ink in the pattern spaces, thereby manufacturing a two-layered printing circuit substrate. Thus, if these processes are repeated, a plurality of conductive layers 30, 30A, 30B, and 30C can be formed by printing a conductive ink in the pattern spaces of photosensitive insulating layers 20A, 20B, 20C and 20D, respectively and at least one of the photosensitive insulating layers may not have pattern spaces filled with the conductive ink.

Next, as shown in FIG. 1(i), after an adhesive insulating layer 40 is coated on the photosensitive insulating layer 20D, a metallic thin-film 50, such as a copper thin-film, is thermally pressed onto the adhesive insulating layer 40 (step 180). The metallic thin-film 50 is relatively flat so that chips may be easily installed thereon. As seen in FIG. 1(j), the metallic thin-film 50 is etched to form a predetermined pattern 50A and an insulating material 60 is filled in the spaces of the metallic thin-film 50A (step 190).

Finally, as shown in FIG. 1(k), through holes 70 extend from a top surface of the multi-layer substrate to a bottom surface of the multi-layer substrate and are formed through the substrate 10, holes 11, conductive layers 30, 30A, 30B, and 30C, photosensitive insulating layers 20A, 20B, 20C, and 20D, adhesive insulating layer 40 and metallic thin-film patterns 50A (step 200). A conductive ink 70A is implanted into through holes 70, thereby completing the multi-layered circuit substrate. The conductive ink 70A electrically interconnects the conductive layers 30, 30A, 30B, and 30C formed between pattern spaces of the insulating material and the metallic thin-film 50A. If the substrate 10 consists of a metal, holes 11 are formed larger than the through holes 70 by 100 to 200 $\mu$m. Thus, the insulating material 12 has sufficient thickness so to provide electric insulation upon formation of the through holes 70.

FIG. 2 is a cross-sectional view showing an embodiment of the multi-layered circuit substrate manufactured by the method shown in FIGS. 1(a)–1(k). The same reference numbers are used in FIG. 2 to refer to the same or like parts shown in FIGS. 1(a)–1(k).

The multi-layered circuit substrate shown in FIG. 2 includes a substrate 10; a plurality of photosensitive insulating layers 20A, 20B, 20C, and 20D and pattern spaces 22 (see FIG. 1(f)) formed on the substrate 10; conductive ink layers 30, 30A, 30B, and 30C formed in the pattern spaces 22; a metallic thin-film 50A of a predetermined pattern adhered to the insulating layer 20D and conductive ink layer 30C by an adhesive insulating layer 40; and through holes 70 electrically connecting the conductive layers 30, 30A, 30B, and 30C to the metallic thin-film 50A.

Regardless of the conductivity, various materials such as metal, ceramic, or insulating material can be used as the substrate 10. Preferably, a metal material, e.g., an alloy 42, a copper alloy, or the like, is used as the substrate 10. Various kinds of metal materials may be selected which provide excellent heat-stability and heat-emissivity. If a conductive metal is used as the substrate 10, then holes 11 are formed in substrate 10 and the insulating material 12 is formed on the surface of the substrate 10 and in the holes 11.

Each photosensitive insulating layer 20A, 20B, 20C, or 20D is a photoresist layer having a glass transition temperature (Tg) of 200° C. or more. The conductive ink is composed of minute metal powders (e.g., Cu-Pb-Sn, Ag-Pb-Sn, etc.), a polymerizing reactive material such as anhydride-series compound (e.g., Hexafluoroisopropyl-diphthalic anhydride), and a solvent (e.g., methyl ethyl ketone, acetone, etc.). Preferably, Ormet 2005® (developed by Toranaga Co., U.S.A.) is used as the conductive ink. The metallic thin-film 50A provides an excellent flat surface so that components, such as chips, may be easily loaded thereon. When the substrate 10 consists of a metal, the insulating material 12 is formed in the through holes 70.

Another embodiment of the present invention will be described with reference to FIGS. 3(a) and (b). Reference numerals which are repeated represent the same or like parts as described in the previous drawings.

Figure 3A:
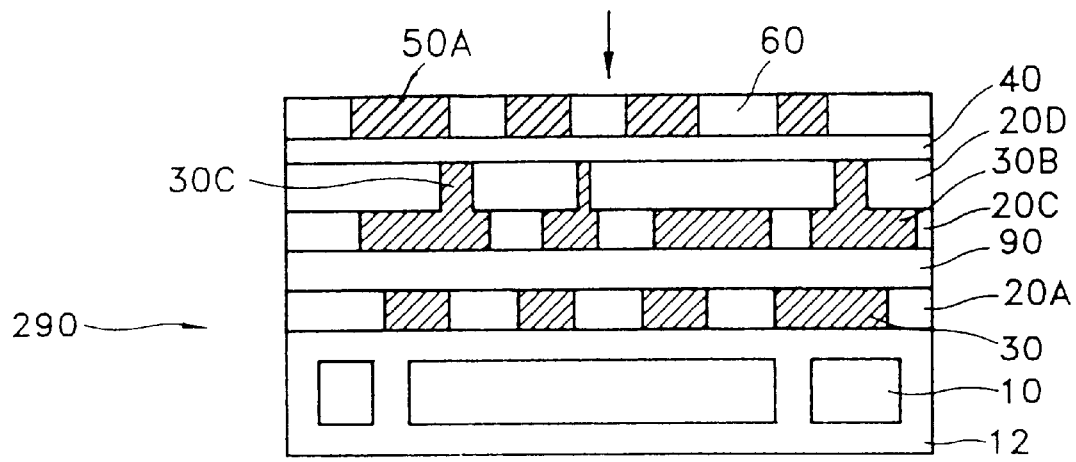
FIGS. 3(a) and (b) are cross-sectional views showing some steps of a method of manufacturing a multi-layered circuit substrate according to another embodiment of the present invention.
Figure 3B:
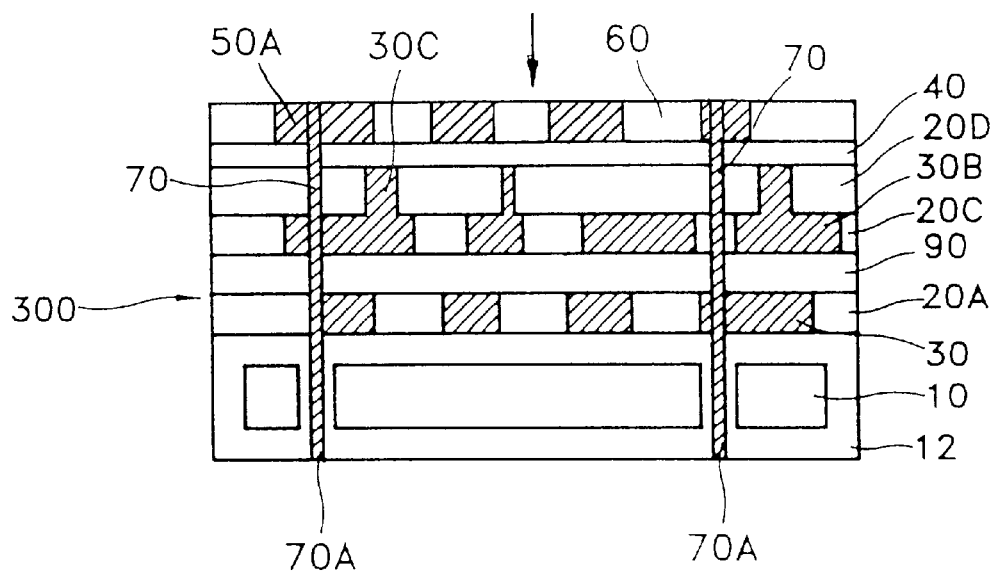

According to this embodiment, pattern spaces 22 are not formed in at least one photosensitive insulating layer 90 (step 290), as shown if FIG. 3(a). The other steps are performed the same as the steps shown in FIGS. 1(a)–1(k). Even if the photosensitive insulating layer 90 serves as a mere insulating layer, through holes 70 can still electrically connect the conductive ink layers 30, 30A, and 30B to the metallic thin-film 50A.

As described above, the multi-layered circuit substrate according to the present invention provides a simple structure, and thus, increases manufacturing productivity. Also, since the substrate need not be a metal substrate, one may select from various materials and thus reduce production costs. Finally, the flatness of the metallic thin-film on the uppermost portion of the circuit substrate enables wire bonding to be easily performed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A multi-layered circuit substrate, comprising:

a substrate;

a plurality of layers formed on said substrate, each layer comprising a photosensitive insulating layer portion having a predetermined pattern and pattern spaces and a conductive layer portion formed of a conductive ink in at least some of said pattern spaces;

a metallic thin-film of a predetermined pattern adhered on an uppermost layer of said plurality of layers by an adhesive insulating material; and a conductive material injected into a through hole of said multi-layer substrate, said through hole extending from a top surface of said plurality of layers to a bottom surface of said substrate, and being formed through said substrate, said plurality of layers, and said metallic thin-film to electrically interconnect each of said conductive layers and the metallic thin film.

2. A multi-layered circuit substrate as recited in claim 1, wherein the conductive ink includes minute metal powders, a polymerizing reactive material, and a solvent.

3. A multi-layered circuit substrate as recited in claim 2, wherein the minute metal powders are selected from the group consisting of Cu-Pb-Sn and Ag-Pb-Sn, the polymerized reactive material is an anhydride-series compound, and the solvent is selected from the group consisting of methyl ethyl ketone and acetone.

4. A multi-layered circuit substrate as recited in claim 3, wherein the polymerizing reactive material is hexafluoroisopropyl-diphthalic anhydride.

5. A multi-layered circuit substrate as recited in claim 1, wherein said substrate is formed of a ceramic.

6. A multi-layered circuit substrate as recited in claim 1, wherein said substrate is formed of a metal selected from the group consisting of copper alloy and alloy 42.

7. A multi-layered circuit substrate as recited in claim 6, wherein a bore is formed in a portion of said substrate where said through hole of said multi-layered substrate is formed, wherein an insulating material is formed on the surface of said substrate and in the bore of said substrate prior to the formation of the plurality of layers on the substrate.

8. A multi-layered circuit substrate as recited in claim 7, wherein the diameter of said bore is larger than the diameter of said through hole, such that said conductive material injected into said through hole is electrically insulated from said substrate by the insulating material filled within said hole.

9. A multi-layered circuit substrate as recited in claim 1, wherein said metallic thin-film is made of copper.

10. A multi-layered circuit substrate, comprising:

a substrate having a bore formed there through, wherein said substrate and said bore are coated with an insulating material;

a plurality of layers formed on said substrate, each layer comprising a photosensitive insulating layer portion having a predetermined pattern and pattern spaces and a conductive layer portion formed of a conductive ink in at least some of said pattern spaces;

a metallic thin-film of a predetermined pattern adhered on an uppermost layer of said plurality of layers by an adhesive insulating material; and a conductive material injected into a through hole of said multi-layer substrate, said through hole extending from a top surface of said plurality of layers to a bottom surface of said substrate, said hole being formed through said substrate and said bore of said substrate, said plurality of layers, and said metallic thin-film to electrically interconnect each of said conductive layers and the metallic thin film.

11. A multi-layered circuit substrate, comprising:

a substrate having a bore formed there through, and wherein said substrate and said bore are coated with an insulating material;

a plurality of layers formed on said substrate, each layer comprising a photosensitive insulating layer having predetermined pattern and pattern spaces and a conductive layer formed of a conductive ink in said pattern spaces;

a metallic thin-film of a predetermined pattern adhered on an uppermost layer of said plurality of layers by an adhesive insulating material; and a conductive material injected into a through hole of said multi-layer substrate, said through hole being formed through said substrate and said bore of said substrate, said plurality of layers, and said metallic thin-film to electrically interconnect each of said conductive layers and the metallic thin film, wherein the diameter of said bore is larger than the diameter of said through hole, such that said conductive material in said through hole is electrically insulated from said substrate by the insulating material in the bore.

* * * * *